United States Patent
Moschiano et al.

(10) Patent No.: US 10,446,258 B2
(45) Date of Patent: *Oct. 15, 2019

(54) METHODS AND APPARATUS FOR PROVIDING REDUNDANCY IN MEMORY

(71) Applicant: MICRON TECHNOLOGY, INC., Boise, ID (US)

(72) Inventors: Violante Moschiano, Avezzano (IT); Giovanni Santin, Rieti (IT); Maria-Luisa Gallese, Avezzano (IT); Luigi Pilolli, L'Aquila (IT)

(73) Assignee: Micron Technology, Inc., Boise, ID (US)

( * ) Notice: Subject to any disclaimer, the term of this patent is extended or adjusted under 35 U.S.C. 154(b) by 52 days.

This patent is subject to a terminal disclaimer.

(21) Appl. No.: 15/721,994

(22) Filed: Oct. 2, 2017

(65) Prior Publication Data

US 2018/0047460 A1 Feb. 15, 2018

Related U.S. Application Data

(60) Division of application No. 14/940,327, filed on Nov. 13, 2015, now Pat. No. 9,779,839, which is a continuation of application No. 13/208,502, filed on Aug. 12, 2011, now Pat. No. 9,202,569.

(51) Int. Cl.
*G11C 29/00* (2006.01)
*G11C 16/04* (2006.01)

(52) U.S. Cl.
CPC ........ *G11C 29/846* (2013.01); *G11C 16/0483* (2013.01); *G11C 29/76* (2013.01); *G11C 29/82* (2013.01); *G11C 2229/723* (2013.01)

(58) Field of Classification Search
CPC ....... G11C 29/846; G11C 29/76; G11C 29/82; G11C 16/0483; G11C 2229/723
USPC ...................................... 365/189.05
See application file for complete search history.

(56) References Cited

U.S. PATENT DOCUMENTS

| | | |
|---|---|---|
| 5,227,999 A | 7/1993 | Ihara et al. |
| 5,297,085 A | 3/1994 | Choi et al. |
| 5,751,647 A | 5/1998 | O'Toole |
| 6,819,596 B2 | 11/2004 | Ikehashi et al. |
| 6,967,868 B2 | 11/2005 | Kim et al. |
| 7,324,389 B2 | 1/2008 | Cernea |
| 7,515,469 B1 | 4/2009 | Chen et al. |
| 7,733,697 B2 | 6/2010 | Picca et al. |

(Continued)

*Primary Examiner* — Sung Il Cho
(74) *Attorney, Agent, or Firm* — Dicke, Billig & Czaja, PLLC

(57) ABSTRACT

Methods for providing redundancy in a memory include mapping a portion of first data associated with an address of the memory determined to indicate a defective memory cell to an address of a redundant area of the memory array, and writing second data to the memory array, wherein a portion of the second data is written to a column of the memory array associated with the address of the memory determined to indicate a defective memory cell for the first data. Apparatus include memory control circuitry configured to select a portion of data for mapping to a different address in response to an address indicating a defective memory cell, and further configured to select a different portion of data for a particular row than for a different row, wherein the particular row and the different row are associated with the same columns of the memory array.

20 Claims, 6 Drawing Sheets

(56) References Cited

U.S. PATENT DOCUMENTS

| | | | | |
|---|---|---|---|---|
| 8,395,943 B2* | 3/2013 | Kang | | G11C 16/20 |
| | | | | 365/185.01 |
| 8,473,791 B2 | 6/2013 | Shaw et al. | | |
| 2004/0240268 A1* | 12/2004 | Kim | | G11C 29/846 |
| | | | | 365/185.09 |
| 2006/0018159 A1* | 1/2006 | Picca | | G11C 29/76 |
| | | | | 365/185.17 |
| 2006/0050576 A1* | 3/2006 | Kim | | G06F 11/1068 |
| | | | | 365/200 |
| 2006/0109715 A1* | 5/2006 | Lee | | G11C 29/846 |
| | | | | 365/185.17 |
| 2007/0043398 A1* | 2/2007 | Ternes | | A61N 1/362 |
| | | | | 607/18 |
| 2007/0109856 A1* | 5/2007 | Pellicone | | G11C 29/76 |
| | | | | 365/185.09 |
| 2007/0220935 A1* | 9/2007 | Cernea | | G11C 29/846 |
| | | | | 70/370 |
| 2008/0065937 A1* | 3/2008 | Micheloni | | G06F 11/1068 |
| | | | | 714/711 |
| 2008/0239809 A1* | 10/2008 | Chae | | G11C 11/5621 |
| | | | | 365/185.09 |
| 2009/0185421 A1 | 7/2009 | Yun et al. | | |
| 2010/0067312 A1* | 3/2010 | Lee | | G11C 7/1063 |
| | | | | 365/189.07 |
| 2010/0195401 A1* | 8/2010 | Jeong | | G11C 16/10 |
| | | | | 365/185.19 |
| 2010/0302828 A1* | 12/2010 | Park | | G11C 8/10 |
| | | | | 365/49.1 |
| 2011/0267899 A1* | 11/2011 | Kim | | G11C 29/846 |
| | | | | 365/189.05 |
| 2012/0002487 A1* | 1/2012 | Kim | | G11C 16/20 |
| | | | | 365/189.2 |
| 2012/0020175 A1* | 1/2012 | Lee | | G11C 29/82 |
| | | | | 365/200 |
| 2012/0106270 A1* | 5/2012 | Park | | G11C 29/808 |
| | | | | 365/189.17 |
| 2014/0169092 A1 | 6/2014 | Miyamoto et al. | | |

* cited by examiner

METHODS AND APPARATUS FOR PROVIDING REDUNDANCY IN MEMORY

RELATED APPLICATIONS

This application is a Divisional of U.S. patent application Ser. No. 14/940,327 filed Nov. 13, 2015, now U.S. Pat. No. 9,779,839 issued on Oct. 3,2017, which is a Continuation of U.S. patent application Ser. No. 13/208,502 filed Aug. 12, 2011, now U.S. Pat. No. 9,202,569 issued on Dec. 1, 2015 which are commonly assigned and incorporated herein by reference in its entirety.

TECHNICAL FIELD

The present embodiments relate generally to memory and a particular embodiment relates to column redundancy in a memory device.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical non-volatile memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type are determined by the presence or absence of the charge in the charge storage structure.

Non-volatile memory devices typically have a reserved area in the memory array for redundant columns (e.g., bit lines) of memory cells. The redundant columns can be used when a particular address is determined to indicate a defective memory cell (with such an address being sometimes referred to herein as a "defective address"). For example, a bit line-to-bit line shorting condition or a single cell failure can use a redundant column to repair the defective condition.

Mapping a redundant column to a defective column typically comprises comparing each received address to a list of defective addresses while a data load operation is being performed. If an address to be programmed is found to be defective, the system deselects the defective address and selects the corresponding redundant column. Since the comparing is performed in real time as the data to be programmed is loaded into the page buffer, the architecture needs to be fast enough to follow the I/O speed in order to reduce any data bottlenecks. This can result in difficult design constraints for timing purposes.

The redundant column mapping also maps an entire column when only a single memory in a column has been determined to be defective. For example, one defective memory address can result in a byte or more of the redundant column area of the memory array being assigned to repair the defective address. This can result in an ineffective use of redundant columns of memory cells.

For the reasons stated above and for other reasons that will become apparent to those skilled in the art upon reading and understanding the present specification, there is a need in the art for a more efficient scheme for redundancy.

DETAILED DESCRIPTION

Figure 1:
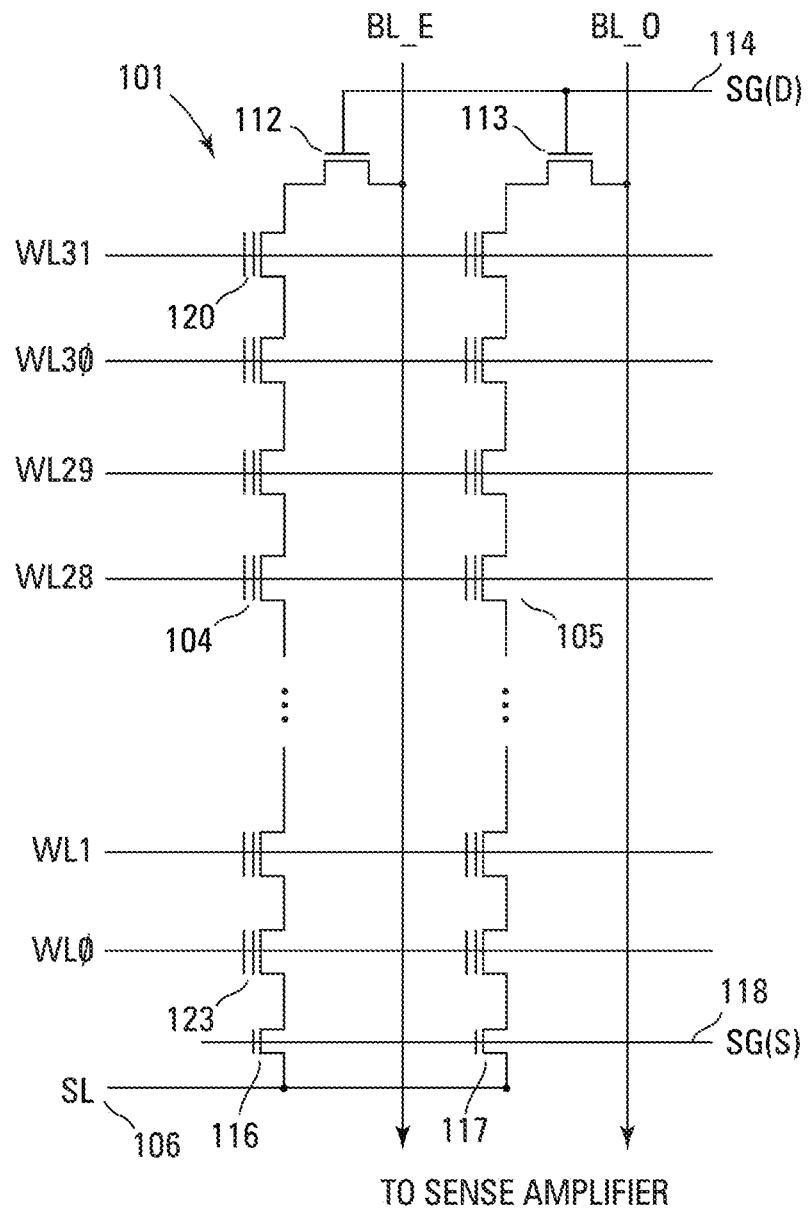
FIG. 1 shows a schematic diagram of one embodiment of a portion of a NAND architecture memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101 comprising series strings of non-volatile memory cells. The schematic diagram of FIG. 1 is for purposes of illustration only as the memory array architecture is not limited to the illustrated NAND architecture. Alternate embodiments can use NOR or other architectures as well.

The memory array 101 comprises an array of non-volatile memory cells (e.g., floating gate) arranged in columns such as series strings 104, 105. Each of the cells is coupled drain to source in each series string 104, 105. An access line (e.g. word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually each bit line is coupled to a page buffer with sense circuitry that detects the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or a multiple level cell (MLC). Each cell's threshold voltage ($V_t$) is indicative of the data that is stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

Figure 2A:
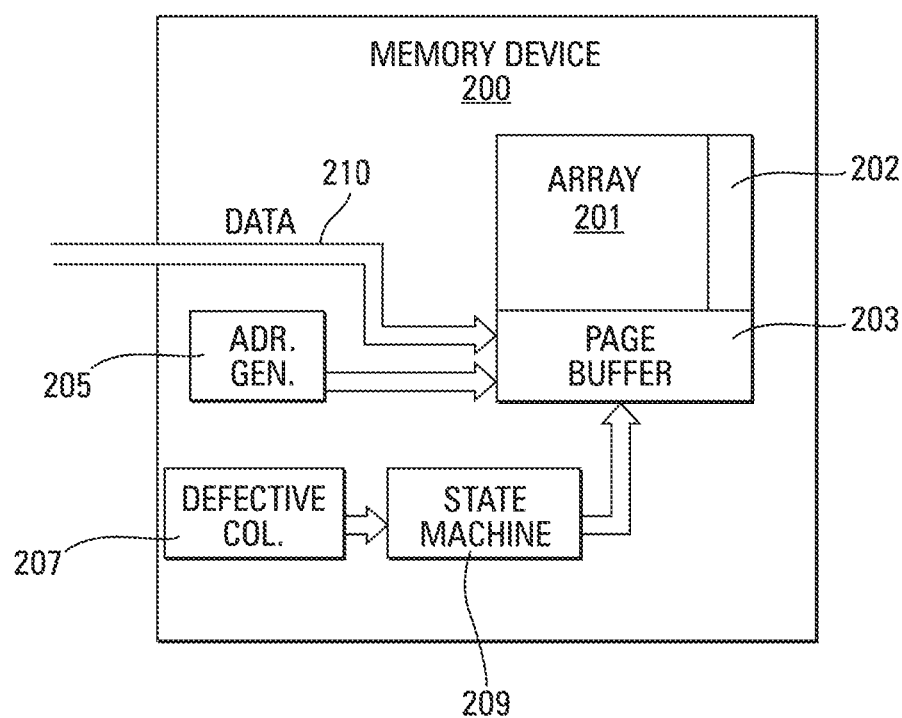
FIGS. 2A and 2B show block diagrams of one embodiment of a column redundancy scheme.
Figure 2B:
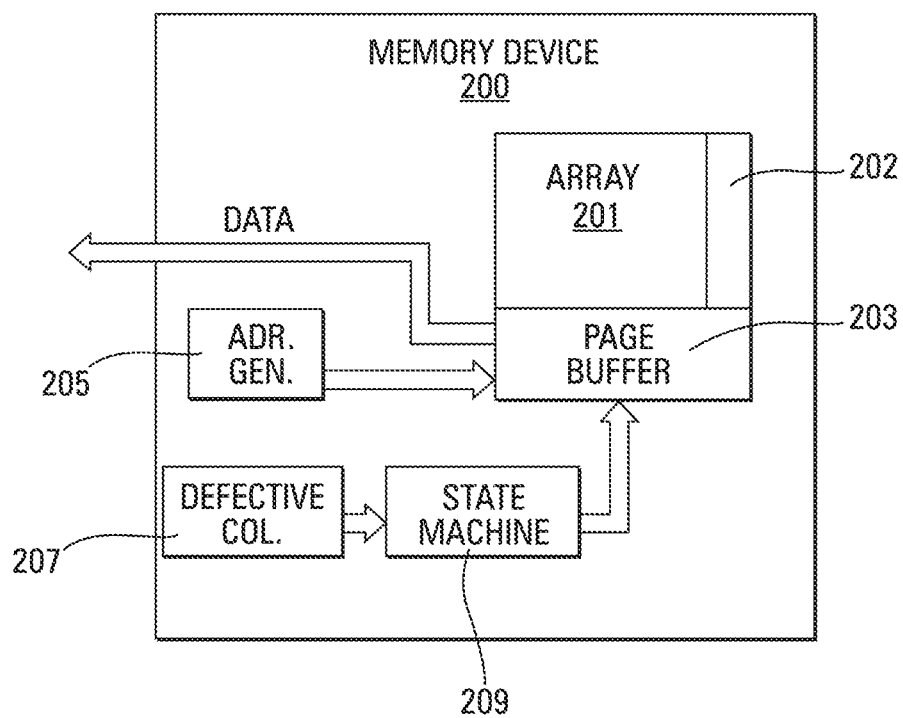

FIGS. 2A and 2B illustrate block diagrams of one embodiment of a column redundancy scheme that can be used with a memory array such as the array illustrated in FIG. 1. FIG. 2A illustrates the column redundancy scheme as used in a programming operation. FIG. 2B illustrates the column redundancy scheme as used in a sense (e.g., read) operation.

FIG. 2A illustrates the memory device 200 that includes a memory array 201 such as the portion of the array illustrated in FIG. 1. The array 201 includes redundant column area 202 set aside for column redundancy. As described previously, the redundant column area 202 of the array provides redundant (e.g., back-up) memory cells for replacing memory cells determined to be defective in the main memory array 201.

A page buffer 203 is coupled to the memory array 201 and redundant column area 202. The page buffer 203 temporarily stores data that is to be written to the memory array 201 during a programming operation. The data 210 are input from input/output (I/O) connections of the memory device. As will be seen with reference to FIG. 2B, the page buffer 203 also stores data that has been read from the memory array 202.

An address generator (Adr. Gen.) 205 is coupled to the page buffer 203. The address generator 205 generates the addresses for programming data as it is being written to the page buffer 203. Each address determines where in the page buffer associated data is to be programmed. The page buffer addresses are each associated with a respective address in the memory array to which the data are to be programmed.

A defective column memory block 207 is coupled to a state machine 209 that is coupled to the page buffer 203. The defective column memory block 207 stores the column addresses of the memory array 201 that have been determined to indicate a defective memory cell or cells. In one embodiment, the defective column address determination can be accomplished during a self-test of the memory array whenever the memory device 200 is powered-up. An alternate embodiment might determine which cells are defective during manufacture of the memory device and store the addresses of those defective cells in the defective column memory block 207.

The state machine 209 can be hardware, software, or a combination of hardware and software. The state machine 209 can be executed by a controller or the controller along with executable code might be considered a state machine.

In operation, a data load operation occurs prior to the programming of the memory array 201. During the data load operation, the data are stored in the page buffer 203 without any skipping for defective column addresses as is done in the prior art. In other words, the defective address matching is not performed during the data loading operation of the page buffer 203.

The loaded data are confirmed to be properly stored into the page buffer 203. The state machine 209 then maps (e.g., copies) the data from the page buffer addresses associated with defective addresses in the memory array 201 to page buffer addresses associated with redundant memory cells. The state machine can also exclude the defective addresses from the pass/fail checking of the memory array 201. The data are then transferred from the page buffer 203 to the appropriate addresses in the memory array 201 for programming.

Since the state machine 209 manages each bit of the page buffer 203, the illustrated column redundancy scheme can operate on a per bit or per byte basis. The prior art replaced the entire column of memory cells.

FIG. 2B illustrates substantially the same architecture as FIG. 2A. However, the data in FIG. 2B is being read from the memory array 201.

In the read operation embodiment of FIG. 2B, the read operation transfers the data read from the memory array 201 to the page buffer 203 for temporary storage. The data are read from locations in the memory array 201 and transferred to their associated locations in the page buffer 203 without address skipping for defective addresses, as is done in the prior art. After a read verify of data in the page buffer 203, the state machine 209 maps (e.g., copies, moves) the data from the page buffer address associated with the redundant column address to the page buffer address associated with the defective column address. The data are then output to the I/O connections with their appropriate addresses.

Figure 3:
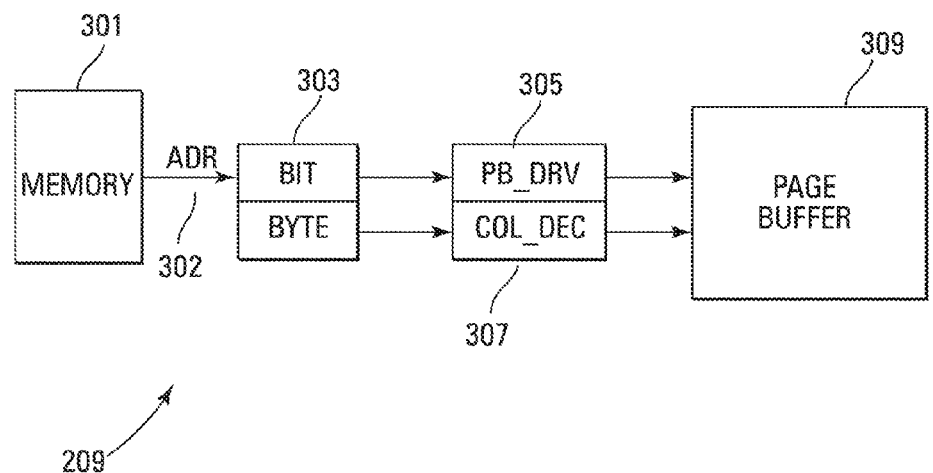
FIG. 3 shows a functional block diagram of one embodiment of a state machine in accordance with the embodiment of FIGS. 2A and 2B.

FIG. 3 illustrates a functional block diagram of one embodiment of a state machine in accordance with the embodiment of FIGS. 2A and 2B. The block diagram of FIG. 3 is for purposes of illustration only as the state machine can be implemented in other ways, both software and hardware.

The state machine can include a memory block 301 (e.g., SRAM) configured to store addresses of the memory determined to indicate defective memory cells. For example, the address might indicate that bit 3 of a particular byte is defective. A BIT/BYTE block 303 is coupled to the memory block 301. The defective address (ADR) that is read from the memory block 301 is passed 302 to the BIT/BYTE block 303. The BIT/BYTE block 303 provides a logic function (e.g., decoder) that selects the defective bit or byte (e.g., 011 of 00001000), depending on how many bits are defective.

The PB_DRV block 305, coupled between the BIT portion of the BIT/BYTE block 303 and the page buffer 309, provides a driver function to control the page buffer 309. In the present example of bit 3 being defective, the PB_DRV block 305 enables just the bit<3> of page buffer address 00001000.

The COL_DEC block 307, coupled between the BYTE portion of the BIT/BYTE block 303 and the page buffer 309, provides a column decoder function for accessing the page buffer 309. This block 307 generates signals to select the proper byte according to the address from the memory block 301.

Figure 4:
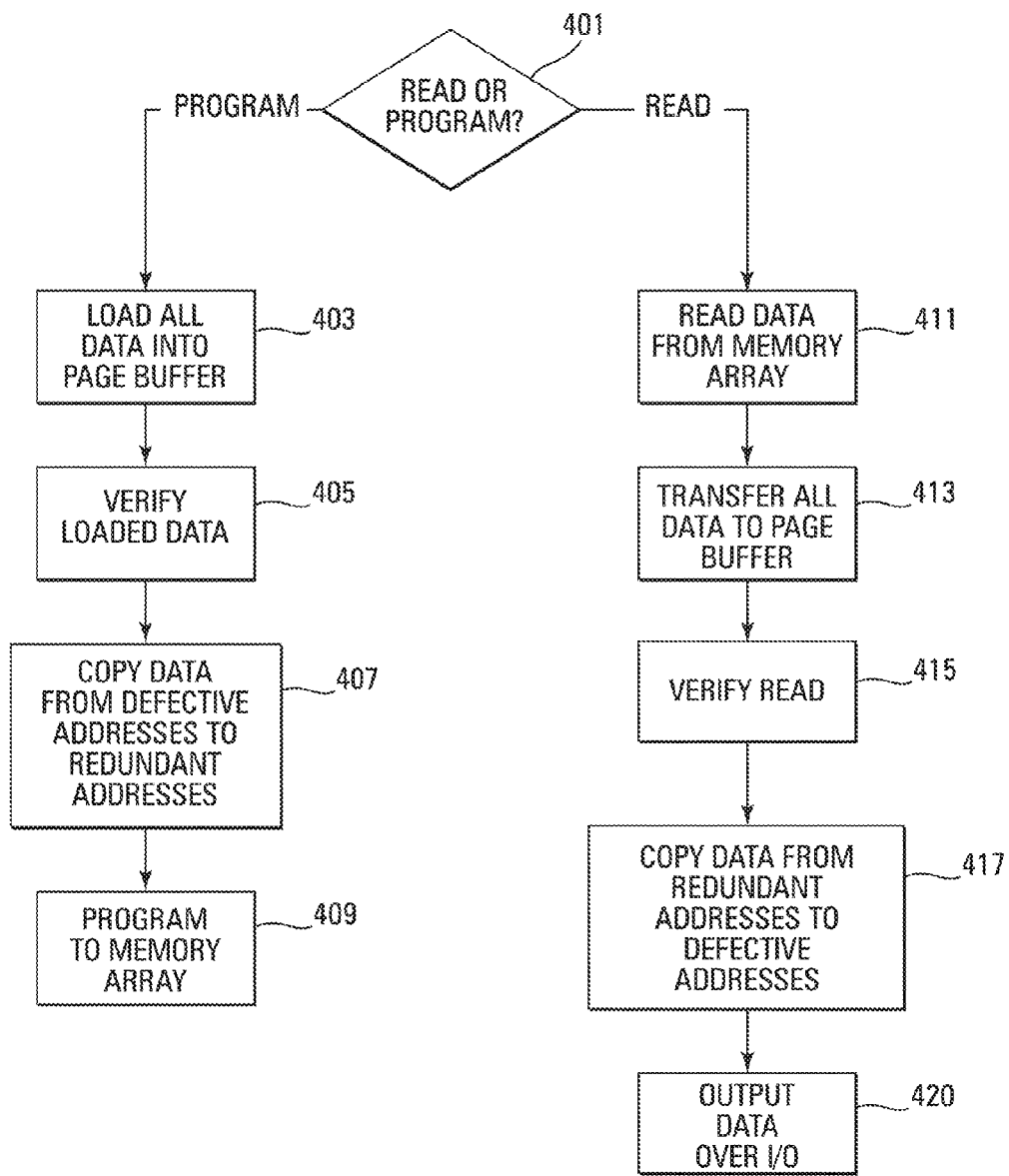
FIG. 4 shows a flowchart of one embodiment of a method for providing column redundancy in accordance with the embodiment of FIGS. 2A and 2B.
Figure 5:
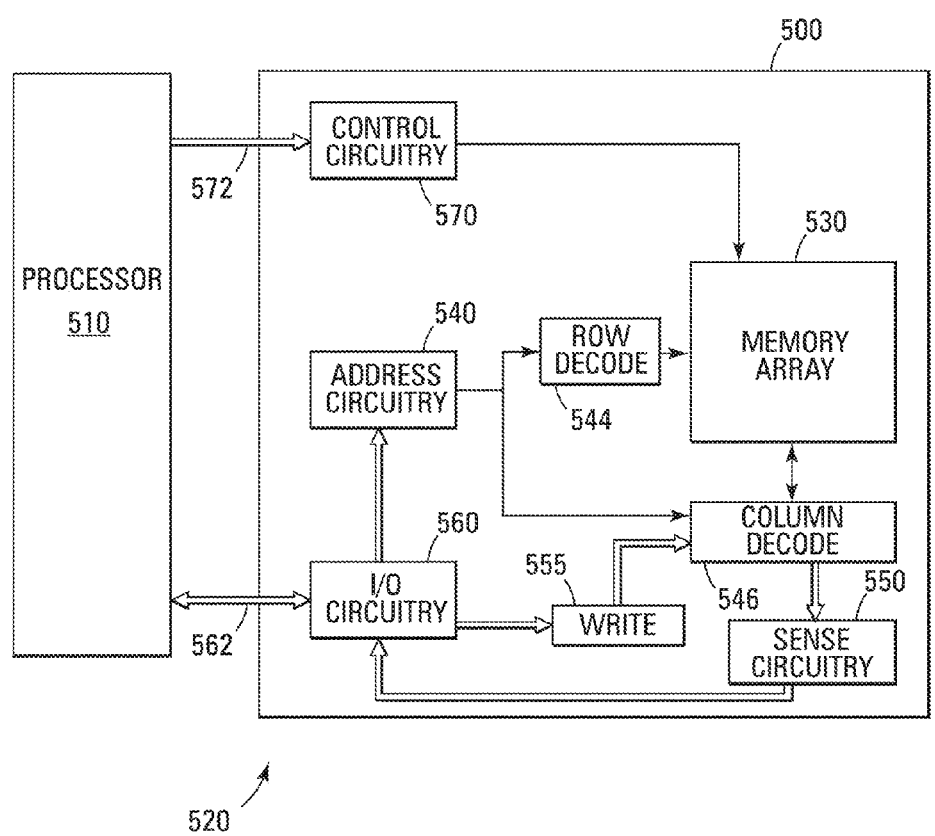
FIG. 5 shows a block diagram of one embodiment of a memory system that can incorporate a stacked memory array architecture using the described methods for sense operations.

FIG. 4 illustrates a flowchart of one embodiment of a method for providing column redundancy in a memory device, such as the device illustrated in FIG. 5. The method determines if a read or program operation is being performed 401.

If a read operation is being performed, data is read from the memory array 411 and all the data are loaded into the page buffer 413. Unlike the prior art, no address matching is performed at this point and no defective addresses are skipped. Also, when the data are read from the memory array 411, the mapped redundant addresses are read. A read verify is performed to verify that the data have been loaded into the page buffer 415.

The data that were read from the redundant addresses are then mapped (e.g., copied, moved) to the page buffer addresses associated with the originally defective addresses 417. The data are then output over the I/O connections 420.

If a program operation is being performed, data input from the I/O connections are all loaded into the page buffer 403. Unlike the prior art, no address matching is performed at this point and no defective addresses are skipped. The data is then verified to determine that it has been properly loaded into the page buffer 405.

Data that are to be programmed to defective addresses are mapped (e.g., copied, moved) to redundant addresses 407. As shown in FIGS. 2A and 2B, the defective addresses can be determined by reading the defective column memory that stores the defective addresses. The data are then programmed to the memory array 409. The data that were originally assigned to defective addresses are programmed to the mapped redundant memory addresses. The program operation can include a program verify as well.

FIG. 5 illustrates a functional block diagram of a memory device 500 that can comprise the column redundancy scheme in accordance with FIGS. 2A and 2B. The memory device 500 is coupled to a processor 510. The processor 510 may be a microprocessor or some other type of controller. The memory device 500 and the processor 510 form part of a memory system 520. An apparatus can refer to either a device (e.g., a memory device) alone or as part of a system (e.g., a memory system).

The memory device 500 includes an array 530 of memory cells (e.g., non-volatile memory cells) in accordance with the embodiments of FIGS. 2A and 2B. The memory array 530 is arranged in banks of word line rows and bit line columns. In one embodiment, the columns of the memory array 530 comprise series strings of memory cells.

Address buffer circuitry 540 is provided to latch address signals provided through I/O circuitry 560. Address signals are received and decoded by a row decoder 544 and a column decoder 546 to access the memory array 530.

The memory device 500 reads data in the memory array 530 by sensing voltage or current changes in the memory array columns using sense amplifier circuitry 550. The page buffers 550, in one embodiment, are coupled to read and latch a row of data from the memory array 530. The page buffers 550, as previously described, include the sense circuitry as well as other circuits for performing a program verify operation. Data are input and output through the I/O circuitry 560 for bidirectional data communication as well as the address communication over a plurality of data connections 562 with the controller 510. Write circuitry 555 is provided to write data to the memory array.

Memory control circuitry 570 decodes signals provided on control connections 572 from the processor 510. These signals are used to control the operations on the memory array 530, including data read, data write (program), and erase operations. The memory control circuitry 570 may be a state machine, a sequencer, or some other type of controller to generate the memory control signals. In one embodiment, the memory control circuitry 570 is configured to control execution of the column redundancy embodiments of the present disclosure.

The memory device illustrated in FIG. 5 has been simplified to facilitate a basic understanding of the features of the memory. A more detailed understanding of internal circuitry and functions of flash memories are known to those skilled in the art.

CONCLUSION

In summary, one or more embodiments of redundancy provide redundant memory cells for memory cells determined to be defective on a bit-by-bit or byte-by-byte basis. By performing the mapping (e.g., copying, moving) after all the data has been loaded into the page buffer, from either the I/O connections during a program operation or the memory array during a read operation, the need for real time address comparison can be eliminated along with its associated problems.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for providing redundancy in a memory, wherein the memory has a memory array and one or more addresses of the memory array have been determined to indicate a defective memory cell, the method comprising:
   loading first data for programming into a particular row of the memory array;
   mapping a portion of the first data between an address of the memory array determined to indicate a defective memory cell of a particular column of the memory array and an address of a redundant area of the memory array;
   loading second data for programming into a different row of the memory array, wherein the different row of the memory array includes a memory cell of the particular column of the memory array; and
   mapping a portion of the second data between an address of the memory array determined to indicate a defective memory cell of a different column of the memory array and an address of a redundant area of the memory array, and without mapping any portion of the second data between an address of the memory array of the particular column of the memory array and an address of a redundant area of the memory array.

2. The method of claim 1 wherein the data is mapped on a bit-by-bit basis.

3. The method of claim 1 wherein the data is mapped on a byte-by-byte basis.

4. The method of claim 1, further comprising inputting the first and second data from I/O connections of the memory.

5. The method of claim 4, further comprising loading the first data into a buffer prior to programming any portion of the first data, and loading the second data into a buffer prior to programming any portion of the second data.

6. The method of claim 5, wherein mapping comprises copying or moving data from an address of the buffer to a different address of the buffer.

7. An apparatus comprising:
   a memory array having a redundant area, and having rows associated with access lines and columns associated with bit lines;
   a buffer for holding data prior to be programmed to the memory array or to be read from the memory array;
   a memory block configured to store addresses of the memory array indicating a defective memory cell; and
   memory control circuitry configured to select a portion of data from the buffer for mapping to a different address of the buffer in response to an address indicating a defective memory cell;
   wherein the memory control circuitry is further configured to select a different portion of data from the buffer for a particular row of the memory array than for a different row of the memory array; and wherein the particular row of the memory array and the different row of the memory array are associated with the same columns of the memory array.

8. The apparatus of claim 7, wherein the memory control circuitry further comprises a logic function to select either a bit or a byte of data responsive to an address indicating a defective memory cell.

9. The apparatus of claim 8, wherein the logic function comprises a decoder.

10. The apparatus of claim 8, further comprising:
a driver, coupled between the logic function and the buffer, configured to select a bit in the buffer responsive to an address indicating a defective memory cell; and
a column decoder, coupled between the logic function and the buffer, configured to select a byte in the buffer responsive to an address indicating a defective memory cell.

11. The apparatus of claim 7, wherein the memory control circuitry is configured to control mapping between an address of the memory array indicating a defective memory cell and an address of the redundant area of the memory array during a programming operation, wherein the mapping is performed only after the data has been loaded into the buffer and before programming that data into the memory array.

12. The apparatus of claim 7, further comprising an address generator coupled to the buffer and configured to generate addresses for data input through I/O connections to the buffer.

13. The apparatus of claim 7 wherein the memory block configured to store addresses of the memory array indicating a defective memory cell is part of the memory control circuitry.

14. The apparatus of claim 7, wherein the memory control circuitry comprises a state machine.

15. The apparatus of claim 7, wherein the buffer is a page buffer.

16. An apparatus comprising:
a memory array having a redundant area, and having rows associated with access lines and columns associated with bit lines;
a page buffer for holding data prior to be programmed to the memory array or to be read from the memory array;
a memory block configured to store addresses of the memory array indicating a defective memory cell; and
memory control circuitry configured to select a portion of data from the buffer for mapping to a different address of the buffer in response to an address indicating a defective memory cell;
wherein the memory control circuitry is further configured to select a different portion of data from the buffer for a particular row of the memory array than for a different row of the memory array;
wherein the memory control circuitry further comprises a logic function to select either a bit or a byte of data responsive to an address indicating a defective memory cell; and
wherein the particular row of the memory array and the different row of the memory array are associated with the same columns of the memory array.

17. The apparatus of claim 16, further comprising:
a driver, coupled between the logic function and the buffer, configured to select a bit in the buffer responsive to an address indicating a defective memory cell; and
a column decoder, coupled between the logic function and the buffer, configured to select a byte in the buffer responsive to an address indicating a defective memory cell.

18. The apparatus of claim 16, wherein the memory control circuitry is configured to control mapping between an address of the memory array indicating a defective memory cell and an address of the redundant area of the memory array during a programming operation, wherein the mapping is performed only after the data has been loaded into the buffer and before programming that data into the memory array.

19. The apparatus of claim 16, further comprising an address generator coupled to the buffer and configured to generate addresses for data input through I/O connections to the buffer.

20. The apparatus of claim 16, wherein the memory block configured to store addresses of the memory array indicating a defective memory cell is part of the memory control circuitry.

* * * * *